(12) United States Patent
Xue

(10) Patent No.: US 7,240,133 B1
(45) Date of Patent: Jul. 3, 2007

(54) REDUCED-AREA ARCHITECTURE FOR PADDED-PROTOCOL INTERFACE

(75) Inventor: Ning Xue, Fremont, CA (US)

(73) Assignee: Altera Corporation, San Jose, CA (US)

( * ) Notice: Subject to any disclaimer, the term of this patent is extended or adjusted under 35 U.S.C. 154(b) by 477 days.

(21) Appl. No.: 10/964,061

(22) Filed: Oct. 12, 2004

(51) Int. Cl.
*G06F 3/00* (2006.01)
*H03M 7/00* (2006.01)
*H03M 7/04* (2006.01)
*G06F 13/12* (2006.01)
*G06F 13/38* (2006.01)
*G06F 13/16* (2006.01)

(52) U.S. Cl. .................. 710/68; 710/5; 710/6; 710/65; 710/70; 709/246; 709/247; 341/50; 341/67

(58) Field of Classification Search ............ 710/5, 710/6, 65, 68, 70; 341/50, 67; 709/246, 709/247
See application file for complete search history.

(56) References Cited

U.S. PATENT DOCUMENTS

| | | | |
|---|---|---|---|
| 4,486,739 A | 12/1984 | Franaszek et al. | 340/347 |
| 5,574,504 A * | 11/1996 | Yagasaki et al. | 375/240.13 |
| 6,650,140 B2 | 11/2003 | Lee et al. | 326/39 |
| 6,724,328 B1 | 4/2004 | Lui et al. | 341/101 |
| 6,728,924 B1 * | 4/2004 | Lou et al. | 714/776 |
| 6,750,675 B2 | 6/2004 | Venkata et al. | 326/41 |
| 7,050,583 B2 * | 5/2006 | Montgomery | 380/37 |
| 2001/0033188 A1 | 10/2001 | Aung et al. | 327/141 |
| 2004/0140837 A1 | 7/2004 | Venkata et al. | 327/235 |

OTHER PUBLICATIONS

Lee et al. U.S. Appl. No. 10/059,014, filed Jan. 29, 2002.
Venkata et al. U.S. Appl. No. 10/273,899, filed Oct. 16, 2002.
Venkata et al. U.S. Appl. No. 10/317,262, filed Dec. 10, 2002.
Venkata et al. U.S. Appl. No. 10/317,264, filed Dec. 10, 2002.
Venkata et al. U.S. Appl. No. 10/714,069, filed Nov. 14, 2003.
Walker, Rick, et al., "64b/66b coding update," Presentation at IEEE 802.3ae, Albuquerque, New Mexico (Mar. 6, 2000).

* cited by examiner

*Primary Examiner*—Tammara Peyton
*Assistant Examiner*—Joshua D. Schneider
(74) *Attorney, Agent, or Firm*—Fish & Neave IP Group of Ropes & Gray LLP; Jeffrey H. Ingerman

(57) ABSTRACT

A data converter for a padded protocol interface performs, on a first data sample, decoding operations requiring data from second and third data samples, while buffering the second data sample without buffering the third data sample. A state machine controlling the decoding operation waits an additional clock cycle, until the second sample has become the current sample and the third sample has become the second sample and thus is available.

14 Claims, 5 Drawing Sheets

REDUCED-AREA ARCHITECTURE FOR PADDED-PROTOCOL INTERFACE

BACKGROUND OF THE INVENTION

This invention relates to circuitry for handling communication of digital information to which bits are added periodically for synchronization or the like, and more particularly to an interface having reduced area as compared to previously known such interfaces.

A communication protocol that is increasingly of interest is known as "64b/66b encoding." This is a protocol in which 64 bits of data are scrambled (e.g., to achieve balance between the number of binary ones and the numbers of binary zeros that need to be transmitted so that there is no net direct current in the transmission) and two additional bits having one or more particular sequences are transmitted with each 64 bits as synchronization information. Thus for every 64 bits of information that need to be sent, 64 information bits and two SYNC bits are transmitted. The SYNC bits may be the sequence "10" or "01". Extra bits of this kind may sometimes be referred to herein as "padding." At the receiver end, the encoded "padded" data are decoded to remove the padding bits.

Serial communication of padded information can be a challenge because of possibly complicated clocking issues. For example, 66 bits of information may need to be transmitted in the time in which the data source produces 64 bits of real data. Similarly, the receiver circuitry needs to receive 66 bits in the time in which it will subsequently pass on the 64 bits of real data in that 66-bit transmission.

Circuitry for solving this problem, and allowing the different data widths to operate at different rates, so that the total number of bits transferred during a single clock cycle matches, is known, and is commonly referred to informally as a "gearbox."

Thus, at the transmitter end, the data—e.g., 64 bits, are encoded to add in the two padding bits. The padded—e.g., 66-bit—groupings are then passed through a transmitter gearbox, where the larger number of padded bits used for processing—e.g., 66 bits—must be converted to the smaller number of bits—e.g., 64 bits (generally a power of 2 to be compatible with standard serializer-deserializers)—for transmission.

At the receiver end, the smaller—e.g., 64-bit—groupings of transmitted padded data are run through a receiver gearbox, where the smaller, but still padded, number of bits used for transmission—e.g., 64 bits—must be converted to the true, larger number—e.g., 66 bits—of padded data, which then can be decoded to remove the padding bits and restore the original unpadded—e.g., 64-bit—data.

In accordance with IEEE Standard 802.3ae-2002, published Aug. 30, 2002, such decoding at the receiver has heretofore been performed under control of a state machine set forth in that standard. That state machine requires knowledge of a current sample to be decoded, as well as the two following samples. Accordingly, a receiver for such a padded protocol—e.g., 64b/66b encoding—has heretofore had to include buffering for two samples, each of which is 66 bits wide.

It would be desirable to be able to provide such receiver decoding circuitry with reduced buffering requirements, so that the chip area occupied by such a receiver could be reduced.

SUMMARY OF THE INVENTION

The present invention includes a data receiver incorporating a padded protocol converter based on a state machine that requires the buffering of only one sample in addition to the sample being decoded. The invention is based on a trade-off between area and speed. At some point in the operation of the state machine in the converter according to the invention, the next sample becomes the current sample, and the third sample (the sample following the next sample) becomes the next sample. In accordance with the invention, the state machine of the converter waits one additional clock cycle until the following sample becomes available by virtue of having become the next sample. The converter is therefore made smaller by eliminating the need to buffer the third sample.

Thus, in accordance with the present invention there is provided a method for converting padded input data at a first data width to unpadded data at a second data width, where the conversion requires operating on three consecutive samples of the padded input data. The method includes, during one or more clock cycles, deriving control data (specifically, data type information) from a first sample of the padded input data, storing the first sample and the control data derived from the first sample, deriving control data from a second sample of the padded input data, and operating in accordance with the control data from the first and second samples. During an additional clock cycle beyond the one or more clock cycles, the first sample is discarded, the second sample and the control data derived from the second sample are stored, control data are derived from a third sample of the padded input data, and operations are performed in accordance with the control data from at least the third sample. By virtue of the operations in accordance with the control data from said first and second samples and the third sample, the first sample is decoded.

In addition, in accordance with the present invention there are provided a data converter operating in accordance with the method, and a data receiver incorporating such a converter.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
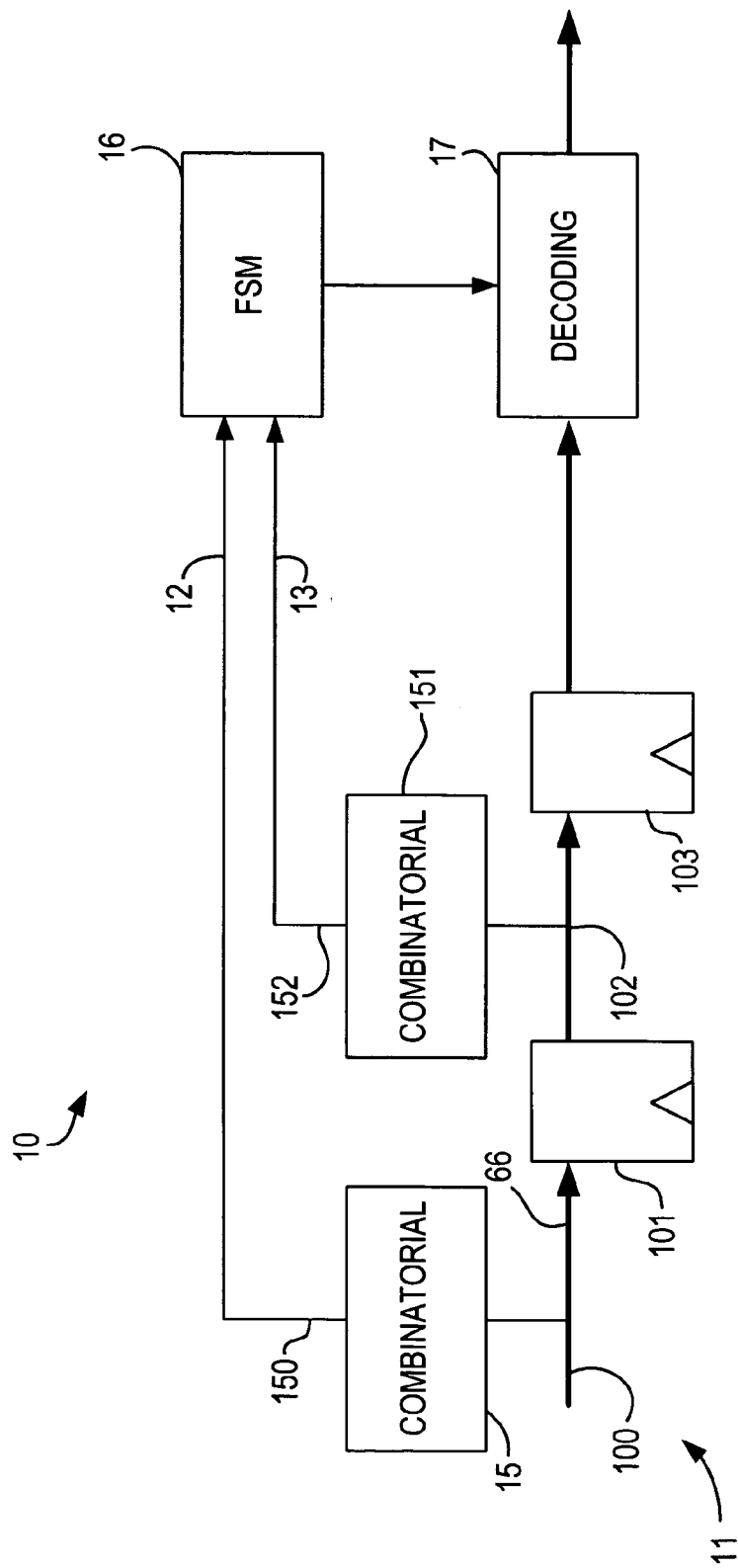
FIG. 1 is a schematic representation of a previously known data converter of the type of which the present invention is an improvement.
Figure 2:
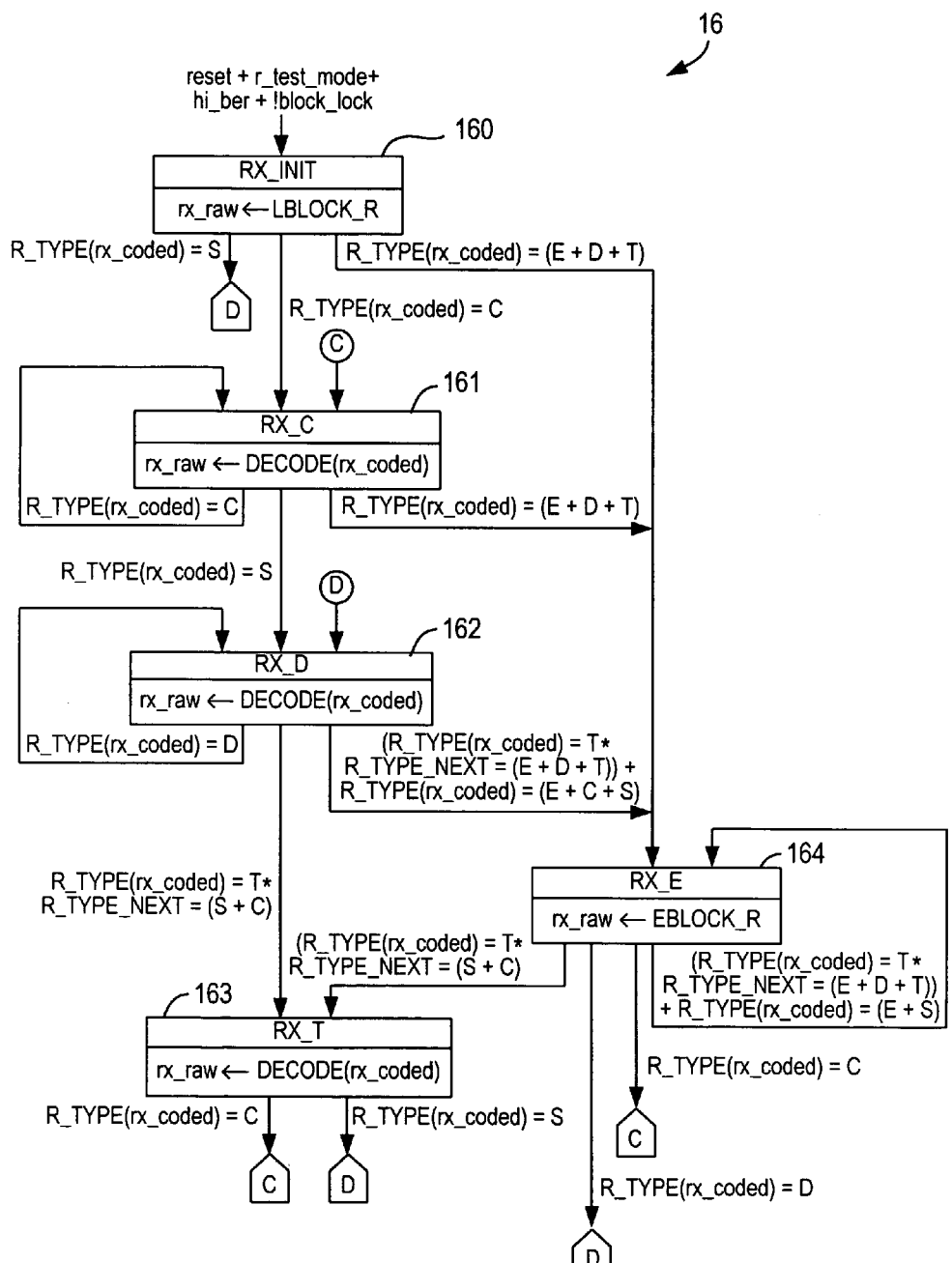
FIG. 2 is a representation of state machine incorporated in the data converter of FIG. 1.

A previously known data converter 10 in accordance with the aforementioned IEEE standard, and its state machine, are shown in FIGS. 1 and 2. As seen in FIG. 1, the encoded or padded data to be decoded (after reception and processing through a gearbox as described above) move along the lower signal path 11, while control signals move along the upper signal paths 12, 13.

In a first clock cycle, a first group or sample of padded data arrives at 100, where it is stored in buffer 101, and also directed to combinatorial function 15 where data type information 150 needed for decoding is derived. In a steady state, data type information 150 is used in state machine 16 with other data type information from previous samples to direct the operation of decoder 17. However, if the system has just been started, nothing will be done with these data or data type information.

In a second clock cycle, the first sample arrives at 102 and is stored in buffer 103, and in addition is directed to combinatorial function 151 where data type information 152 is derived. At the same time, a second sample arrives at 100 and is processed there just as the first sample was processed. Again, if this is the only the second cycle after start-up, nothing is done with these data or data type information.

In a third clock cycle, the first sample arrives at decoder 17 to be decoded in accordance with control signals from state machine 16. The second sample arrives at 102 and is stored in buffer 103, and in addition is directed to combinatorial function 151 where data type information 152 is derived and is directed to state machine 16. A third sample arrives at 100 and is processed there just as the first and second samples were processed.

At this point, everything is in place to decode the first sample. The first sample itself is at decoder 17. Data type information derived from the second sample is output from combinatorial function 151 to state machine 16. Also, data type information 15 derived from the third sample is output from combinatorial function 150 to state machine 16.

State machine 16 itself is diagrammed in FIG. 2. In addition to initialization state 160, state machine 16 has a Control (C) state 161, a Data (D) state 162, a Terminate (T) state 163 and an Error (E) state 164. Any incoming data sample also can be classified or coded as Control (C), Data (D), Terminate (T) or Error (E), as well as Start (S).

In the state machine diagram, "rx_coded" refers to the current sample, "R_TYPE(rx_coded)" refers to the data type of following sample, and "R_TYPE_NEXT" refers to the data type of the third sample. As can be seen, "R_TYPE_NEXT" is used in connection with states D and E of state machine 16. If reliance on R_TYPE_NEXT could be eliminated, buffering of the third sample would no longer be required.

Figure 3:
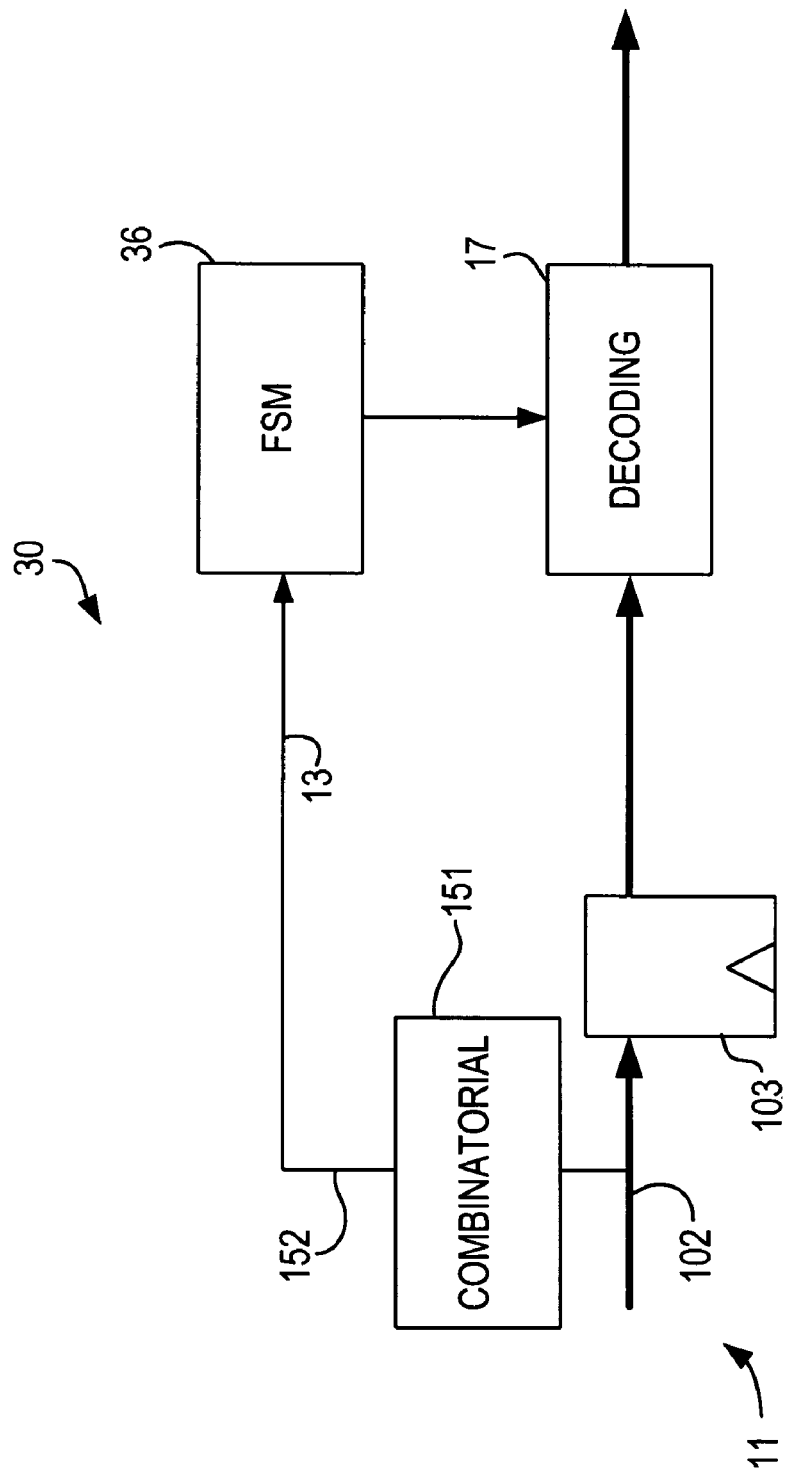
FIG. 3 is a schematic representation of a data converter according to the present invention.
Figure 4:
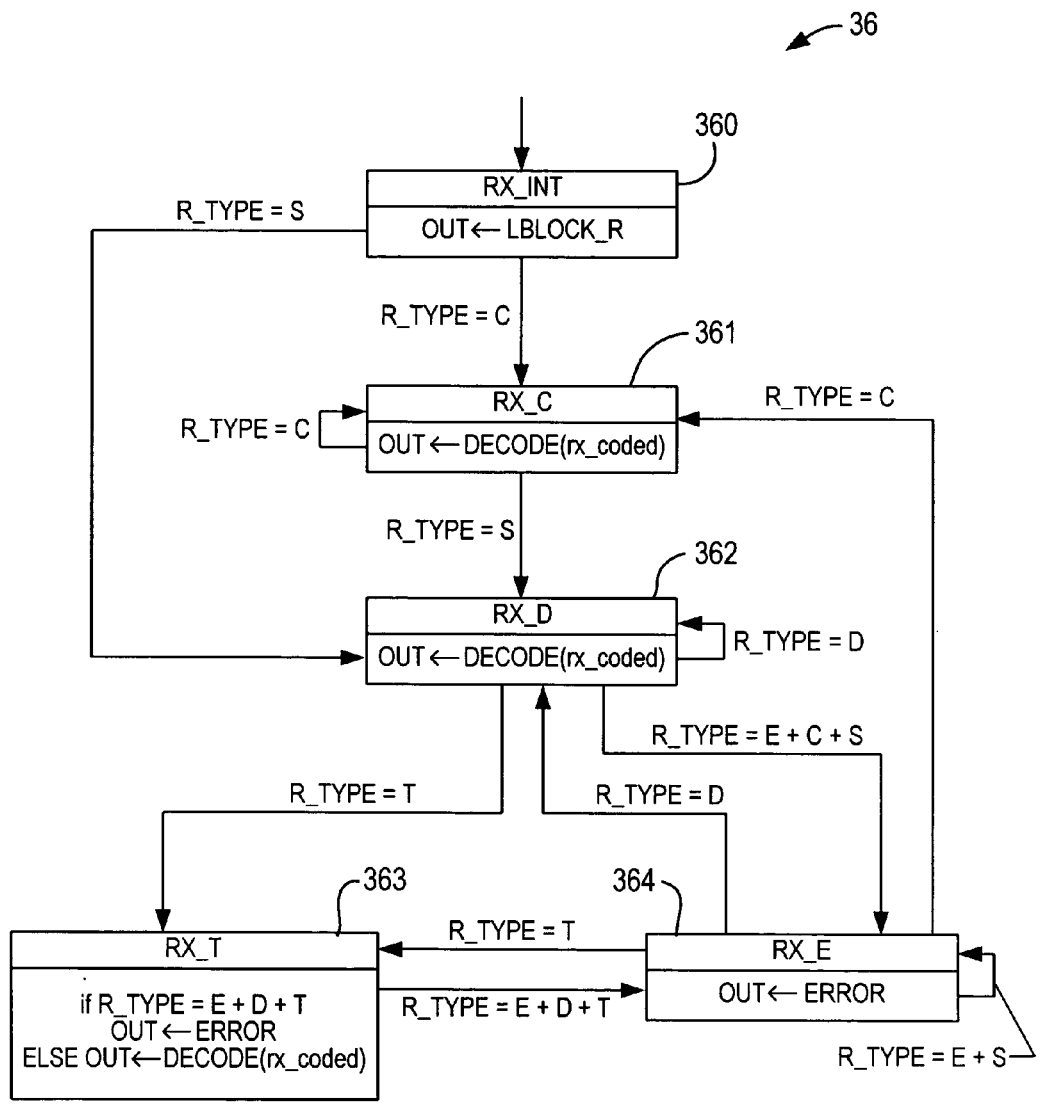
FIG. 4 is a representation of state machine incorporated in the data converter of FIG. 3.

That result is accomplished in converter 30 (FIG. 3) in accordance with the present invention, which preferably includes a modified state machine 36 (FIG. 4). Like state machine 16, state machine 36 preferably has an initialization state 360, a Control (C) state 361, a Data (D) state 362, a Terminate (T) state 363 and an Error (E) state 364. However, as can be seen from FIG. 4, the functioning of state machine 36 preferably relies only on the states of the current sample rx_coded and the data type of the following sample R_TYPE(rx_coded), but does not rely on the third sample.

In order for converter 30 to function properly, state machine 36 must produce the same result as state machine 16. In accordance with the aforementioned IEEE Standard 802.3ae-2002, that requires that a third sample be taken into account. This preferably is achieved in accordance with the present invention by waiting an additional clock cycle, at which time the sample previously represented by R_TYPE (rx_coded) becomes the current sample rx_coded, and the third sample (not previously used by state machine 36) becomes the sample represented by R_TYPE(rx_coded). An additional if-then statement preferably is implemented in Terminate (T) state 363 and the relationships between Terminate (T) state 363 and Error (E) state 364 are adjusted, as shown, to achieve the correct result at the end of the additional clock period. In addition, because the subsequent samples must continue to be processed in the same time periods as in converter 10/state machine 16, in converter 30/state machine 36 during the additional clock cycle, the data sample currently represented by R_TYPE(rx_coded) preferably is processed not only in Terminate (T) state 363 as the "third" sample, but also in the other states as the second sample.

Once a steady state has been achieved, the additional clock cycle required for decoding is not significant. Indeed, although converter 30 must wait in any event until the third sample has arrived before the first sample can be decoded, just as in converter 10, once a steady state has been achieved, each subsequent sample may be decoded one clock cycle sooner that it otherwise would have been decoded in converter 10. This is because in converter 10, each sample, even in a steady state, requires the presence of the two following samples. However, in converter 30, in the steady state, each sample requires only the presence of the immediately following sample. Thus, in addition to being smaller in area than converter 10, converter 30 also may have reduced latency as compared to converter 10. Preferably, the output of state 363 of state machine 36 is the same as the output of state 163 of state machine 16—i.e., DECODE(rx_coded).

Because state machine 36 requires only two samples at any one time, buffer 101 and combinatorial function 15 are eliminated from converter 30, for a reduction of about 66 flip-flops for the buffer and about 50 gates to for combinatorial function, as well as an area savings from eliminating the connections of those components to other components, such as signal path 12. The extra if-then statement in state 363 of state machine 36 can be implemented with five or fewer gates, for a substantial net savings.

It will be apparent that the present invention can be used in other applications involving state machines that require subsequent data samples to process current data samples. As long as it is possible to wait an additional clock cycle for the result, the state machine can be altered to process the subsequent sample during such an additional clock cycle, rather than buffering intervening samples so that all necessary samples are present simultaneously.

A converter according to the present invention may be used in the receiver of a high-speed serial interface in a programmable logic device ("PLD"), that is programmably configurable to handle any of a plurality of communication protocols, including a padded protocol as described above.

Figure 5:
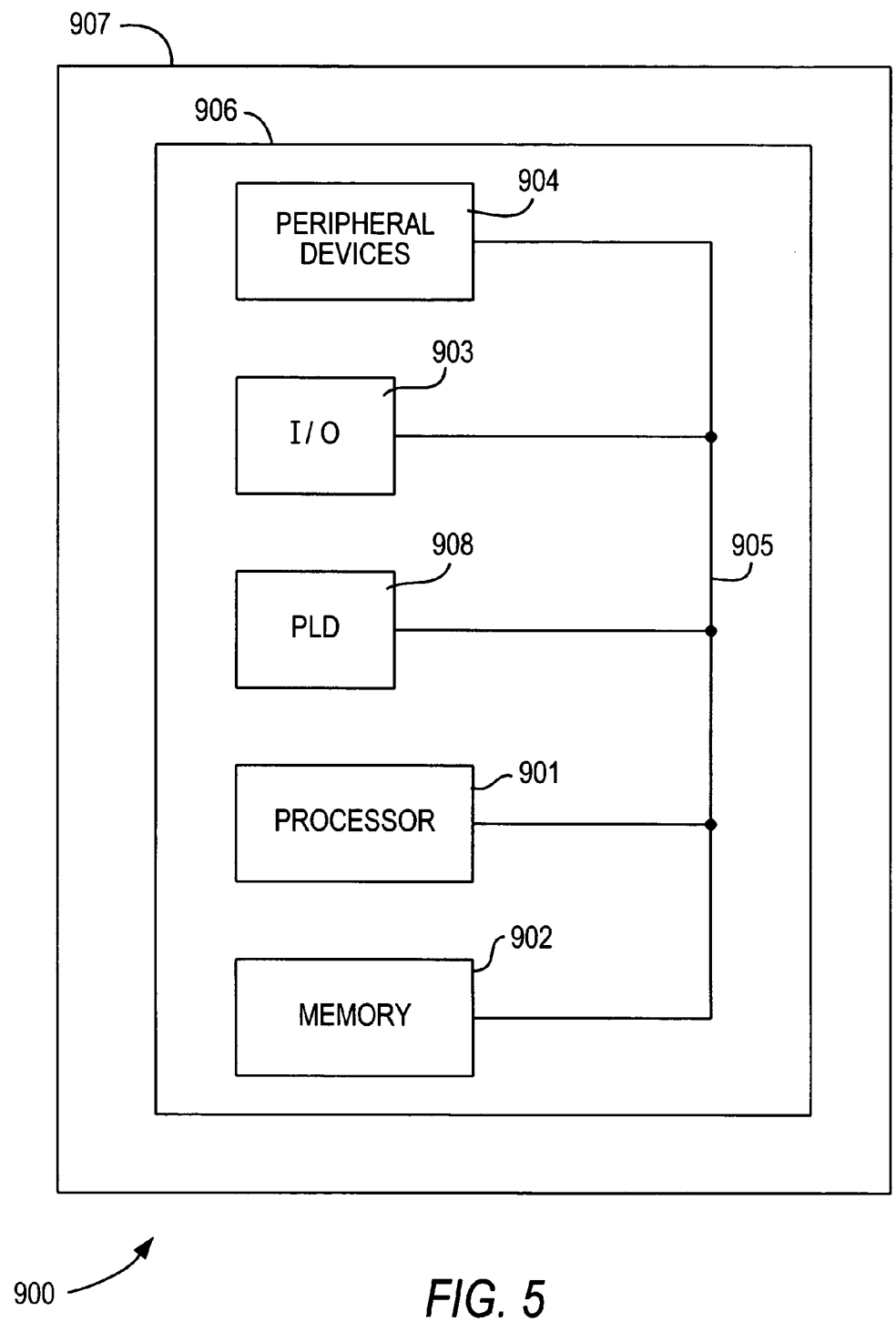
FIG. 5 is a simplified block diagram of an illustrative system employing a data converter in accordance with the present invention.

A PLD 908 incorporating one or more receivers using the components described above according to the present invention may be used in many kinds of electronic devices. One possible use is in a data processing system 900 shown in FIG. 5. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 908 can be used to perform a variety of different logic functions. For example, PLD 908 can be configured as a processor or controller that works in cooperation with processor 901. PLD 908 may also be used as an arbiter for arbitrating access to a shared resources in system 900. In yet another example, PLD 908 can be configured as an interface between processor 901 and one of the other components in system 900. It should be noted that system 900 is only exemplary, and that the true scope and spirit of the invention should be indicated by the following claims.

Various technologies can be used to implement PLDs 908 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method for converting padded input data at a first data width to unpadded data at a second data width, wherein said conversion requires operating on three consecutive samples of said padded input data, said method comprising:
    during one or more clock cycles:
    storing a first sample of said padded input data,
    deriving control data from a second sample of said padded input data and storing said second sample, and
    operating in accordance with said first sample and said control data from said second sample; and
    during an additional clock cycle beyond said one or more clock cycles:
    deriving control data from a third sample of said padded input data and storing said third sample, and
    operating in accordance with said control data from at least said third sample; thereby:
    decoding said first sample of said padded input data in accordance with said control data derived from said second and third samples.

2. The method of claim 1 further comprising:
    during at least said additional clock cycle:
    also treating said stored second sample as a new said first sample; and
    also treating said third sample as a new said second sample, including treating said control data derived from said third sample as control data derived from said new second sample.

3. A data converter for accepting padded input data at a first data width, and outputting unpadded data at a second data width, said data converter comprising:
    a decoder for decoding a first sample of said padded input data;
    a state machine for controlling said decoder based on control data derived from (a) a second sample of said padded input data following said first sample, and (b) a third sample of said padded input data following said second sample, said state machine including states operating on only two samples;
    combinatorial circuitry for deriving said control signals from said samples;
    first storage circuitry for storing one said sample such that two said samples are available at any one time; and
    second storage circuitry for storing control data derived from one said sample; whereby:
    control data derived from only one of said samples are available at any one time; wherein:
    said state machine operates during one or more clock cycles on said control data derived from said second sample;
    said state machine waits for an additional clock cycle, beyond said one or more clock cycles, during which control data derived from said third sample becomes available; and
    said state machine operates on said control data derived from third sample during said additional clock cycle.

4. A programmable logic device comprising the data converter of claim 3.

5. A digital processing system comprising:
    processing circuitry;
    a memory coupled to said processing circuitry; and
    a programmable logic device as defined in claim 4 coupled to the processing circuitry and the memory.

6. A printed circuit board on which is mounted a programmable logic device as defined in claim 4.

7. The printed circuit board defined in claim 6 further comprising:
    memory circuitry mounted on the printed circuit board and coupled to the programmable logic device.

8. The printed circuit board defined in claim 7 further comprising:
    processing circuitry mounted on the printed circuit board and coupled to the memory circuitry.

9. A data receiver comprising the data converter of claim 3.

10. A programmable logic device comprising the data receiver of claim 9.

11. A digital processing system comprising:
    processing circuitry;
    a memory coupled to said processing circuitry; and
    a programmable logic device as defined in claim 10 coupled to the processing circuitry and the memory.

12. A printed circuit board on which is mounted a programmable logic device as defined in claim 10.

13. The printed circuit board defined in claim 12 further comprising:
    memory circuitry mounted on the printed circuit board and coupled to the programmable logic device.

14. The printed circuit board defined in claim 13 further comprising:
    processing circuitry mounted on the printed circuit board and coupled to the memory circuitry.

* * * * *